(12) United States Patent
Chan et al.

(10) Patent No.: US 12,261,610 B2
(45) Date of Patent: Mar. 25, 2025

(54) FREQUENCY LOCKED LOOP CIRCUIT AND CLOCK SIGNAL GENERATION METHOD

(71) Applicant: NOVATEK Microelectronics Corp., Hsinchu (TW)

(72) Inventors: Chin-Tung Chan, New Taipei (TW); Yan-Ting Wang, Hsinchu County (TW); Ren-Hong Luo, Hsinchu (TW); Chih-Wen Chen, Hsinchu County (TW); Hao-Che Hsu, Kaohsiung (TW); Li-Wei Lin, Hsinchu (TW)

(73) Assignee: NOVATEK Microelectronics Corp., Hsinchu (TW)

( * ) Notice: Subject to any disclaimer, the term of this patent is extended or adjusted under 35 U.S.C. 154(b) by 15 days.

(21) Appl. No.: 18/496,908

(22) Filed: Oct. 29, 2023

(65) Prior Publication Data

US 2024/0056086 A1 Feb. 15, 2024

Related U.S. Application Data

(63) Continuation-in-part of application No. 17/661,042, filed on Apr. 27, 2022, now Pat. No. 11,881,865, which is a continuation of application No. 16/727,882, filed on Dec. 26, 2019, now Pat. No. 11,349,488.

(51) Int. Cl.
*H03L 7/099* (2006.01)
*H03L 7/085* (2006.01)
*H03L 7/23* (2006.01)

(52) U.S. Cl.
CPC ............ *H03L 7/099* (2013.01); *H03L 7/085* (2013.01); *H03L 7/23* (2013.01)

(58) Field of Classification Search
CPC .... H03L 7/235; H03L 7/091–097; H03L 7/23
See application file for complete search history.

(56) References Cited

U.S. PATENT DOCUMENTS

| 7,843,279 B2 | 11/2010 | Chou et al. |
| 2003/0030579 A1 | 2/2003 | Koo et al. |

(Continued)

FOREIGN PATENT DOCUMENTS

| CN | 1980029 A | 6/2007 |
| CN | 106664079 A | 5/2017 |
| CN | 111835288 A | 10/2020 |

*Primary Examiner* — Patrick C Chen
(74) *Attorney, Agent, or Firm* — CKC & Partners Co., LLC

(57) ABSTRACT

A frequency locked loop circuit, comprising an operational circuit, a first impedance circuit, a second impedance circuit, a switching circuit and a frequency generation circuit. The operational circuit is configured to output an operational signal according to a voltage difference between a positive terminal and a negative terminal. The switching circuit is configured to periodically conduct the negative terminal to one of the first impedance node and the second impedance node, and periodically conduct the positive terminal to the other one of the first impedance node and the second impedance node. The frequency generation circuit is configured to periodically sample the operational signal to generate a sample signal to generate a clock signal. An operational frequency of the operational signal is an integer multiple of a sampling frequency of the frequency generation circuit.

20 Claims, 10 Drawing Sheets

(56) References Cited

U.S. PATENT DOCUMENTS

| | | | |
|---|---|---|---|
| 2016/0013753 A1* | 1/2016 | Tam | H03B 5/04 |
| | | | 331/111 |
| 2016/0211852 A1 | 7/2016 | Kim et al. | |
| 2017/0040944 A1* | 2/2017 | Satoh | H03B 5/24 |
| 2020/0343858 A1* | 10/2020 | Matsuno | H03B 5/24 |

* cited by examiner

FREQUENCY LOCKED LOOP CIRCUIT AND CLOCK SIGNAL GENERATION METHOD

CROSS-REFERENCE TO RELATED APPLICATION

This application is a Continuation-in-part of U.S. application Ser. No. 17/661,042, filed on Apr. 27, 2022, which is a continuation of U.S. application Ser. No. 16/727,882, filed on Dec. 26, 2019, now U.S. Pat. No. 11,349,488, issued on May 31, 2022, the entirety of which is incorporated by reference herein in their entireties.

BACKGROUND

Technical Field

The present disclosure relates to a frequency locked loop circuit, more particularly, a circuit for outputting a clock signal.

Description of Related Art

In electronic products, the clock generator is indispensable. In order to prevent the clock signal generated by the clock generator from being affected by noise, a frequency locked loop circuit will be applied. However, since the frequency locked loop circuit may still cause noise, the frequency locked loop circuit must be adjusted to ensure that the clock signal is correct and stable.

SUMMARY

One aspect of the present disclosure is a frequency locked loop circuit, comprising an operational circuit, a first impedance circuit, a second impedance circuit, a switching circuit and a frequency generation circuit. The operational circuit comprises a positive terminal and a negative terminal. The operational circuit is configured to output an operational signal according to a voltage difference between the positive terminal and the negative terminal. The first impedance circuit is electrically coupled to a first impedance node. The second impedance circuit is electrically coupled to a second impedance node. The switching circuit is electrically coupled to the first impedance node, the second impedance node, the positive terminal and the negative terminal. The switching circuit is configured to periodically conduct the negative terminal to one of the first impedance node and the second impedance node, and periodically conduct the positive terminal to the other one of the first impedance node and the second impedance node. The frequency generation circuit is electrically coupled to the operational circuit to receive the operational signal, and configured to periodically sample the operational signal to generate a sample signal to generate a clock signal. An operational frequency of the operational signal is an integer multiple of a sampling frequency of the frequency generation circuit.

Another aspect of the present disclosure is a clock signal generation method, comprising: electrically coupling a switching circuit to a first impedance circuit, a second impedance circuit, a positive terminal of an operational circuit and a negative terminal of the operational circuit; outputting, by the operational circuit, an operational signal according to a voltage difference between the positive terminal and the negative terminal; periodically conducting the negative terminal to one of the first impedance circuit and the second impedance circuit by the switching circuit, and periodically conducting the positive terminal to the other one of the first impedance circuit and the second impedance circuit by the switching circuit; periodically sampling, by a frequency generation circuit, the operational signal to generate a sample signal, wherein an operational frequency of the operational signal is an integer multiple of a sampling frequency of the frequency generation circuit; and generating a clock signal according to the sample signal.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
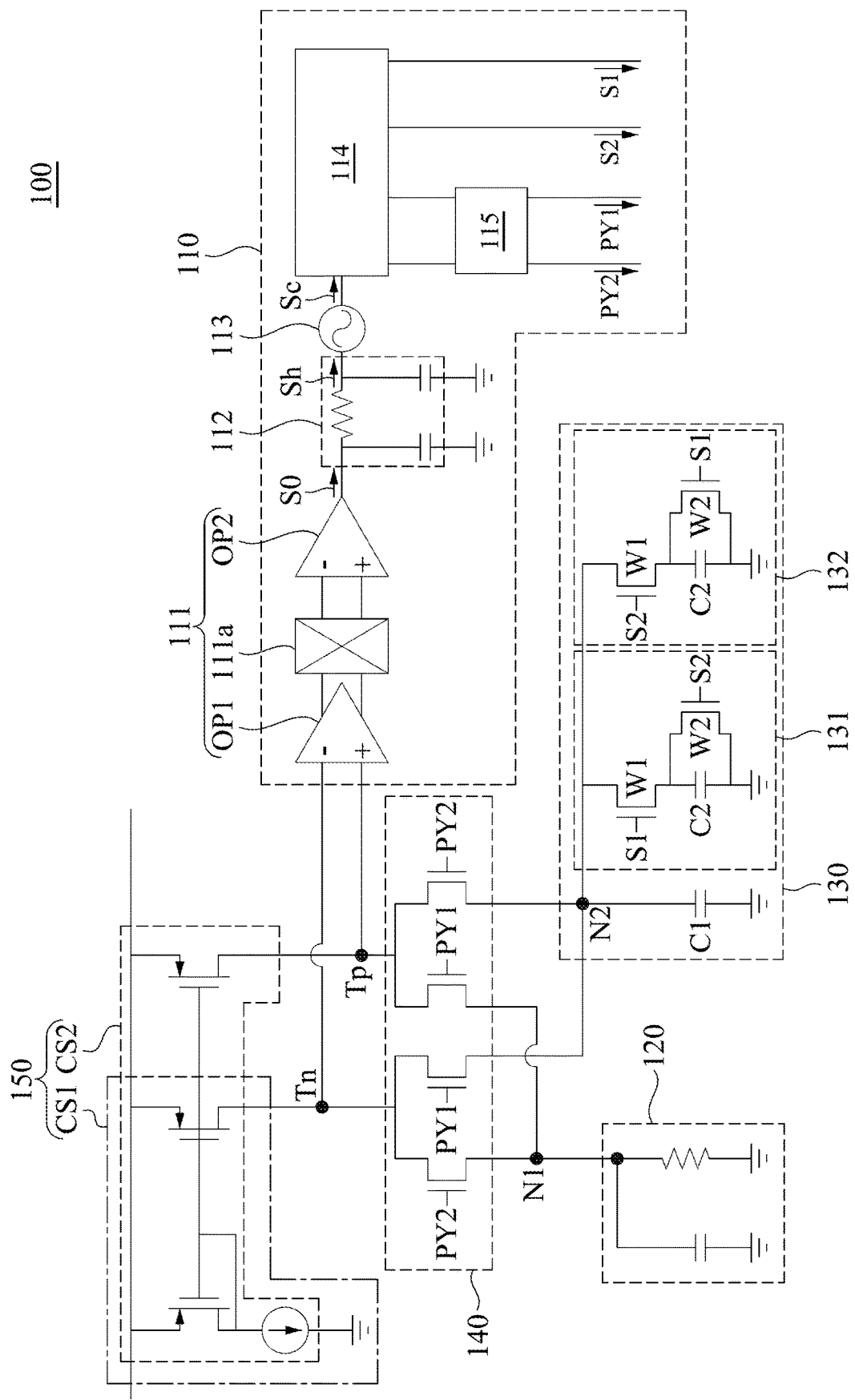
FIG. 1 is a schematic diagram of a frequency locked loop circuit in some embodiments of the present disclosure.

Referring to FIG. 1, FIG. 1 is a schematic diagram of a frequency locked loop (FLL) circuit 100 in some embodiments of the present disclosure. The frequency locked loop circuit 100 includes a frequency generation circuit 110, a first impedance circuit 120, a second impedance circuit 130 and a switching circuit 140. The frequency locked loop circuit 100 is configured to form a loop capable of locking a frequency of an output clock signal Sc. The following briefly describes the operation of the frequency locked loop circuit 100. During operation, a plurality of current sources 150 such as a first current source CS1 and a second current source CS2, are configured to generate a plurality of currents, which are then converted by the first impedance circuit 120 to generate corresponding input voltages. The first impedance circuit 120 provides the corresponding input voltages to the frequency generation circuit 110. The frequency generation circuit 110 is configured to convert the corresponding input voltages to a corresponding frequency, represented by an output clock signal Sc. The output clock signal Sc can be used to generate a plurality of control signals to be feedback to control the operation of the switching circuit 140 and adjusting an impedance value of the second impedance circuit 130, thereby forming a loop capable of locking a frequency of the output clock signal Sc.

The frequency generation circuit 110 can include a positive terminal Tp and a negative terminal Tn. The negative terminal Tn is electrically coupled to a first current source CS1. The positive terminal Tp is electrically coupled to a second current source CS2. The frequency generation circuit 110 is configured to output the output clock signal Sc according to a voltage difference between the positive terminal Tp and the negative terminal Tn.

The first impedance circuit 120 is electrically coupled to a first impedance node N1. The first impedance circuit 120, may include at least one impedance element, which, for example, can include a resistor and a capacitor connected in parallel as shown. The second impedance circuit 130 is electrically coupled to a second impedance node N2. In some embodiments, the impedance value of the second impedance circuit 130 is adjusted according to at least one feedback signal from the frequency generation circuit 110. As shown in FIG. 1, the second impedance circuit 130 is configured to adjust an impedance value of the second impedance circuit 130 according to the output clock signal Sc. Alternatively stated, the impedance value of the second impedance circuit 130 is variable, details will be explained in the following paragraphs. The change of the impedance value of the second impedance circuit 130 according to the feedback signal from the frequency generation circuit 110 causes a difference between the impedance value of the second impedance circuit 130 and an impedance value of the first impedance circuit 120, resulting in a voltage difference between the two impedance nodes N1 and N2, thereby forming a loop capable of locking a frequency of the output clock signal Sc.

The switching circuit 140 is electrically coupled to the first impedance node N1, the second impedance node N2, the positive terminal Tp and the negative terminal Tn. The switching circuit 140 is configured to periodically conduct the negative terminal Tn to one of the first impedance node N1 and the second impedance node N2, and periodically conduct the positive terminal Tp to the other one of the first impedance node N1 and the second impedance node N2. The implementation of the switching circuit 140 can reduce the jitter caused by noises generated by the current sources 150 and the frequency generation circuit 110.

The output clock signal Sc generated by the frequency generation circuit 110, and the frequency of the output clock signal Sc is locked according to the voltage difference between the positive terminal Tp and the negative terminal Tn. However, the signal transmitted by the current source CS1, CS2 has noise causing the jitter. On the other hand, the transistor switch (e.g., transistor in the Operational Amplifier) in the frequency generation circuit 110 also probably generates noise when processing the signal. The embodiment of the present disclosure can periodically switch the negative terminal Tn and the positive terminal Tp to conduct to the first impedance node N1 or the second impedance node N2. Consequently, the jitter caused by noises generated by the current sources 150 and the frequency generation circuit 110 can be reduced.

In addition, the switching circuit 140 is preferably coupled between "the negative terminal Tn/positive terminal Tp" and "the first impedance node N1/second impedance node N2." Therefore, whether the noise is generated in the current sources CS1, CS2 or the frequency generation circuit 110, noise can be reduced or cancelled by the switching operation of the switching circuit 140. As will described below, the switching operations simultaneously performed by the switching circuit 140 and a chopper operational amplifier 111 in the frequency generation circuit 110 can achieve a complete noise cancellation. Consequently, the output clock signal Sc generated by the frequency locked loop circuit 100 can have less jitter.

In some embodiments, the frequency generation circuit 110 is further configured to generate a first clock signal S1 and a second clock signal S2 according to the output clock signal Sc, and provide the first clock signal S1 and the second clock signal S2 to the second impedance circuit 130. The first clock signal S1 and the second clock signal S2 are configured to control the switches in the second impedance circuit 130 so as to adjust the impedance value of the second impedance circuit 130. In some other embodiments, the first clock signal S1 and the second clock signal S2 may be generated by other circuit or processor, instead of the frequency generation circuit 110. Alternatively stated, the first clock signal S1 and the second clock signal S2 are not limited to be generated by feedback path.

In some embodiments, the frequency generation circuit 110 is further configured to generate a first control signal PY1 and a second control signal PY2 according to the output clock signal Sc, and provide the first control signal PY1 and the second control signal PY2 to the switching circuit 140. The first control signal PY1 and the second control signal PY2 are configured to control the switches in the switching circuit 140 so as to change the conduction state of the switching circuit 140.

Referring to the FIG. 1, FIG. 1 also shows a detailed structure of the frequency generation circuit 110 according to an embodiment. In some embodiments, the frequency generation circuit 110 further includes a chopper operational amplifier 111, a low frequency pass filter 112, a frequency conversion circuit 113. The frequency generation circuit 110 can further include a frequency divider 114. The chopper operational amplifier 111 is configured to receive (or detect) the voltage difference between the positive terminal Tp and the negative terminal Tn to output an operational voltage signal S0. For example, the chopper operational amplifier 111 receives the input signal of the frequency generation circuit 110 through the positive terminal Tp and the negative terminal Tn in a preset time. Then, the chopper operational amplifier 111 is capable of averaging the received input signals. Accordingly, low frequency noise in the output signal of the chopper operational amplifier 111 can be eliminated.

In operation, the switching circuit 140 and the chopper operational amplifier 111 can modulate or shift a low-frequency component (flicker noise) of the noise generated by the current sources 150 and the frequency generation circuit 110 to a high-frequency region. The low frequency pass filter 112 can then filter out the high-frequency noise (i.e. the flicker noise). Since the low-frequency component of the flicker noise is the dominant part of the noise, most of the noise can be reduced. In other words, the switching operations simultaneously performed by the switching circuit 140 and the chopper operational amplifier 111 achieve a complete noise cancellation on the output clock signal Sc.

As shown in FIG. 1, in some embodiments, the chopper operational amplifier 111 includes a first operational amplifier unit OP1, a chopper switch unit 111a and a second operational amplifier unit OP2. The chopper switch unit 111a is electrically coupled to the output terminals of the first operational amplifier unit OP1, and periodically switch each one of the output terminals of the first operational amplifier unit OP1 to be coupled between the input terminals of the second operational amplifier unit OP2. The switching operations simultaneously performed by the switching circuit 140 and the chopper operational amplifier 111 achieve noise cancellation of the output clock signal Sc. In more detail, the switching circuit 140 can modulate the signal to a high frequency region. At this time, If a noise comes from the current sources 150 and the first operational amplifier unit OP1 of the frequency generation circuit 110, the noise can remain in the low frequency region. The switching operation of the chopper switch unit 111a can then modulate the signal back and modulate the noise to the high frequency region. Afterwards, the low frequency pass filter 112 can filter out or reduce the noise shifted to the high frequency region. Since people in the art understand the circuit details of the chopper operational amplifier 111, details will not be described here.

The low frequency pass filter 112 is electrically coupled to an output terminal of the chopper operational amplifier 111 to receive the operational voltage signal S0, and configured to filter a high frequency signal Sh of the operational voltage signal S0.

The frequency conversion circuit 113 is configured to receive an output signal of the low frequency pass filter 112 (i.e., the high frequency signal Sh), and generate the output clock signal Sc. The output clock signal Sc can be served as a frequency locked clock signal output by the frequency generation circuit 110.

The frequency divider 114 is coupled to the frequency conversion circuit 113. The frequency divider 114 is configured to generate the first clock signal S1, the second clock signal S2, the first control signal PY1 and the second control signal PY2 according to the output clock signal Sc. The first clock signal S1 and the second clock signal S2 are configured to control the second impedance circuit 130. The first control signal PY1 and the second control signal PY2 are configured to control the switching circuit 140. The frequency divider 114 provides the first clock signal S1 and the second clock signal S2 to the second impedance circuit 130, and provides the first control signal PY1 and the second control signal PY2 to the switching circuit 140.

In some embodiments, the frequency divider 114 generates the first control signal PY1 and the second control signal PY2 by a non-overlapping circuit 115. The non-overlapping circuit 115 is configured to ensure that the first control signal PY1 and the second control signal PY2 are not turned on at the same time or turned off at the same time.

Figure 2:
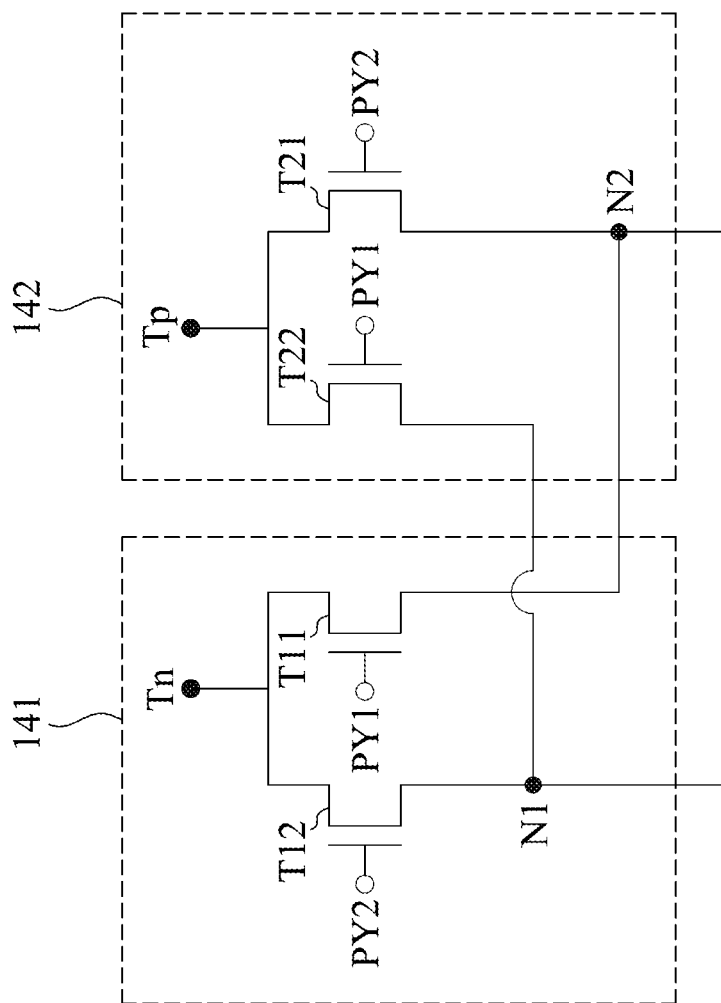
FIG. 2 is a schematic diagram of a switching circuit in some embodiments of the present disclosure.

Referring to FIG. 1 and FIG. 2. FIG. 2 is a schematic diagram of the switching circuit 140 in some embodiments of the present disclosure. The switching circuit 140 includes multiple switching units. In some embodiments, the switching units include a plurality of switching units such as a first switching unit 141 and a second switching unit 142. As shown in FIG. 2, the first switching unit 141 is electrically coupled to the first impedance node N1, the second impedance node N2 and the negative terminal Tn. The first switching unit 141 is configured to conduct the negative terminal Tn to one of the first impedance node N1 and the second impedance node N2 according to a first control signal PY1 and a second control signal PY2.

The second switching unit 142 is electrically coupled to the first impedance node N1, the second impedance node N2 and the positive terminal Tp. The second switching unit 142 is configured to conduct the positive terminal Tp to the other of the first impedance node N1 and the second impedance node N2 according to the first control signal PY1 and the second control signal PY2.

The first switching unit 141 and the second switching unit 142 periodically conduct the negative terminal Tn (or the positive terminal Tp) to the first impedance node N1 or the second impedance node N2 according to the first control signal PY1 and the second control signal PY2. In some embodiments, the frequency of each of the first control signal PY1 and the second control signal PY2 is less than a frequency of the first clock signal S1 and a second clock signal S2. The level of the first control signal PY1 and the level of the second control signal PY2 are opposite.

In some embodiments, each of the switching units 141, 142 includes two transistor switches to periodically conduct the negative terminal Tn (or the positive terminal Tp) to the first impedance node N1 or the second impedance node N2. As shown in FIG. 2, the first switching unit 141 includes a first transistor switch T11 and a second transistor switch T12. The first transistor switch T11 is electrically coupled to one of the first impedance node N1 and the second impedance node N2, and is also electrically coupled to one of the positive terminal Tp and the negative terminal Tn. The second transistor switch is electrically coupled to the other one of the first impedance node N1 and the second impedance node N2, and is also electrically coupled to the one of the positive terminal Tp and the negative terminal Tn.

Specifically, the first transistor switch T11 is electrically coupled to the second impedance node N2 and the negative terminal Tn. The first transistor switch T11 is configured to turn on or turn off according to the first control signal PY1. The second transistor switch T12 is electrically coupled to the first impedance node N1 and the negative terminal Tn. The second transistor switch T12 is configured to turn on or turn off according to the second control signal PY2.

Similarly, the second switching unit 142 includes a first transistor switch T21 and a second transistor switch T22. The first transistor switch T21 is electrically coupled to the second impedance node N2 and the positive terminal Tp. The first transistor switch T21 is configured to turn on or turn off according to the first control signal PY2. The second transistor switch T22 is electrically coupled to the first impedance node N1 and the positive terminal Tp. The second transistor switch T22 is configured to turn on or turn off according to the first control signal PY1.

As described above, the impedance value of the second impedance circuit 130 is adjusted according to the first clock signal S1 and the second clock signal S2. The change of the impedance value of the second impedance circuit 130 according to the feedback signal from the frequency generation circuit 110 causes a difference between the impedance value of the second impedance circuit 130 and an impedance value of the first impedance circuit 120, resulting in a voltage difference between the two impedance nodes N1 and N2, thereby forming a loop capable of locking a frequency of the output clock signal Sc.

Referring to the FIG. 1, in some embodiments, the second impedance circuit 130 includes multiple impedance units such as impedance units 131, 132 and a first capacitor C1. Each of the impedance units 131, 132 is coupled between the second impedance node N2 and a reference voltage (e.g., ground). The first capacitor C1 is coupled between the second impedance node N2 and the reference voltage (i.e., the first capacitor C1 is electrically coupled in parallel with the impedance units 131, 132), and is configured to stabilize the voltage of the second node N2.

Taking the impedance unit 131 as an example, the impedance unit 131 includes a first impedance switch W1, a second impedance switch W2 and a second capacitor C2. The first impedance switch W1 is electrically coupled to the second impedance node N2, and is configured to be controlled according to the output clock signal Sc (e.g., the first clock signal S1). The second impedance switch W2 is electrically coupled to the first impedance switch W1 and the reference voltage. The second impedance switch W2 is configured to be controlled according to the output clock signal Sc (i.e., the second clock signal S2). A conducted timing of the first impedance switch W1 and the second impedance switch W2 are opposite. Alternatively stated, the level of the first clock signal S1 and the level of the second clock signal S2 are opposite. The second capacitor C2 is electrically coupled in parallel to the second impedance switch W2 in parallel.

When the first clock signal S1 is enable, the second clock signal S2 is disable, the first impedance switch W1 is turned on and the second impedance switch W2 turned off. At this time, the second capacitor C2 will be charged by the voltage on the second node N2. On the other hand, when the first clock signal S1 is disable, the second clock signal S2 is enble, the first impedance switch W1 is turned off and the second impedance switch W2 turned on. At this time, the second capacitor C2 will discharge through the second impedance switch W2. Consequently, with the change of the first clock signal S1 and the second clock signal S2, the impedance of the impedance unit 131 can change accordingly.

The circuit structure of the impedance unit 132 is same as the impedance unit 131. However, the first impedance switch W1 of the impedance unit 132 is configured to be controlled according to the second clock signal S2, and the second impedance switch W2 of the impedance unit 132 is configured to be controlled according to the first clock signal S1. Accordingly, the second capacitor C2 of the impedance unit 132 and the second capacitor C2 of the impedance unit 1321 will not charge at the same time or discharge at the same time.

Furthermore, in some embodiments, the frequency locked loop circuit 100 further includes a current mirror including the first current source CS1 and the second current source CS2. The first switching unit 141 is electrically coupled to the first current source CS1 through the negative terminal Tn of the frequency generation circuit 110, and is electrically coupled to the second impedance circuit 130 through the second impedance node N2. The first switching unit 141 is configured to periodically conduct the negative terminal Tn to the first impedance node N1 or the second impedance node N2.

The second switching unit 142 is electrically coupled to the second current source CS2 through the positive terminal Tp of the frequency generation circuit 110, and is electrically coupled to the second impedance circuit 130 through the second impedance node N2. The second switching unit 142 is configured to periodically conduct the positive terminal Tp to the first impedance node N1 or the second impedance node N2.

Figure 3:
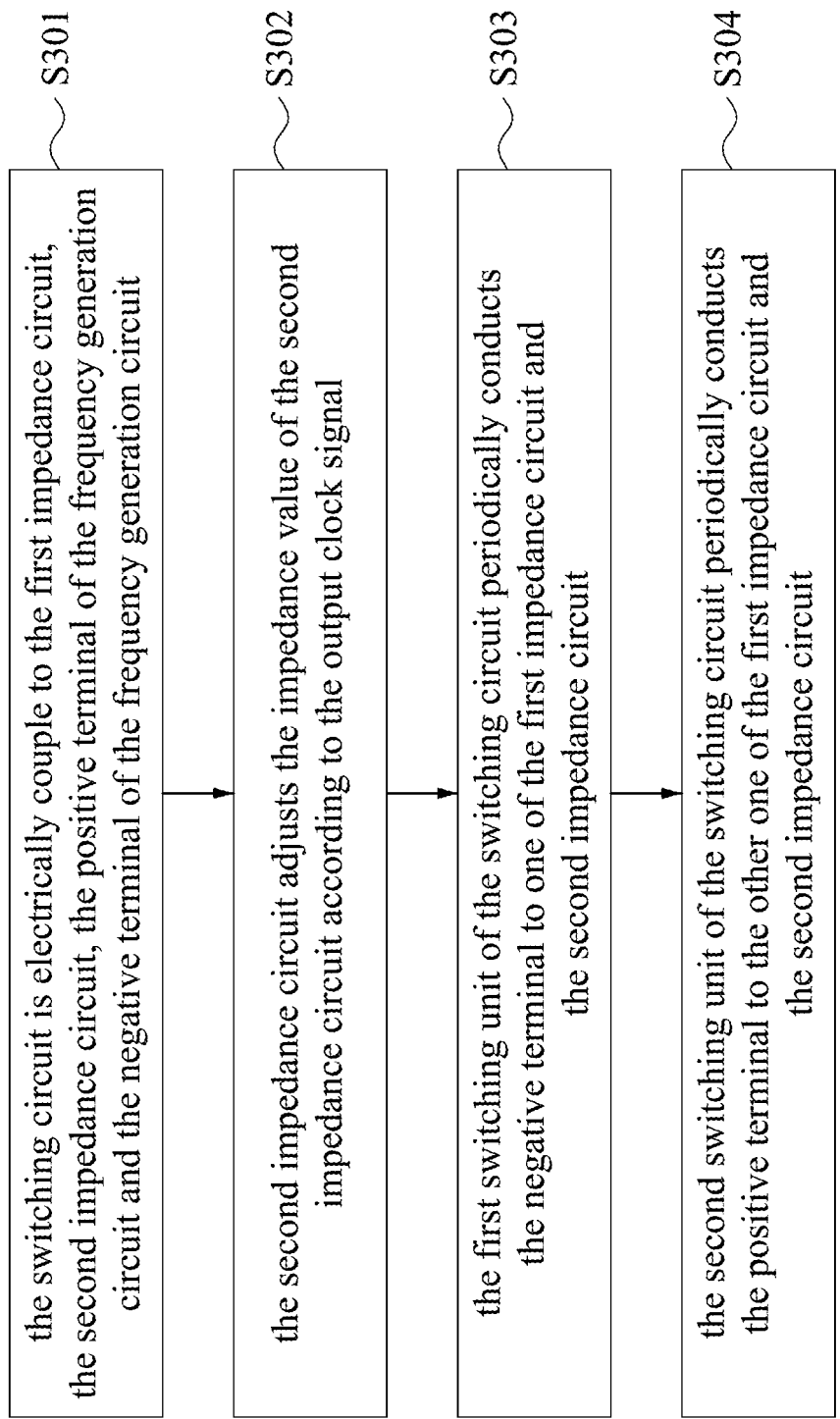
FIG. 3 is a flowchart illustrating a switching method in some embodiments of the present disclosure.

Referring to the FIG. 3, FIG. 3 is a flowchart illustrating a switching method in some embodiments of the present disclosure. In step S301, the switching circuit 140 is electrically couple to the first impedance circuit 120, the second impedance circuit 130, the positive terminal Tp of the frequency generation circuit 110 and the negative terminal Tn of the frequency generation circuit 110. Then, the frequency generation circuit 110 outputs the output clock signal Sc according to a voltage difference between the positive terminal Tp and the negative terminal Tn, and generates the first clock signal S1, the second clock signal S2, the first control signal PY1 and the second control signal PY2 according to the output clock signal Sc.

In step S302, the second impedance circuit 130 adjusts the impedance value of the second impedance circuit 130 according to the output clock signal Sc. In step S303, the first switching unit 141 of the switching circuit 140 periodically conducts the negative terminal Tn to one of the first impedance circuit 120 and the second impedance circuit 130.

In step S304, the second switching unit 142 of the switching circuit 140 periodically conducts the positive terminal Tp to the other one of the first impedance circuit 120 and the second impedance circuit 130.

Figure 4A:
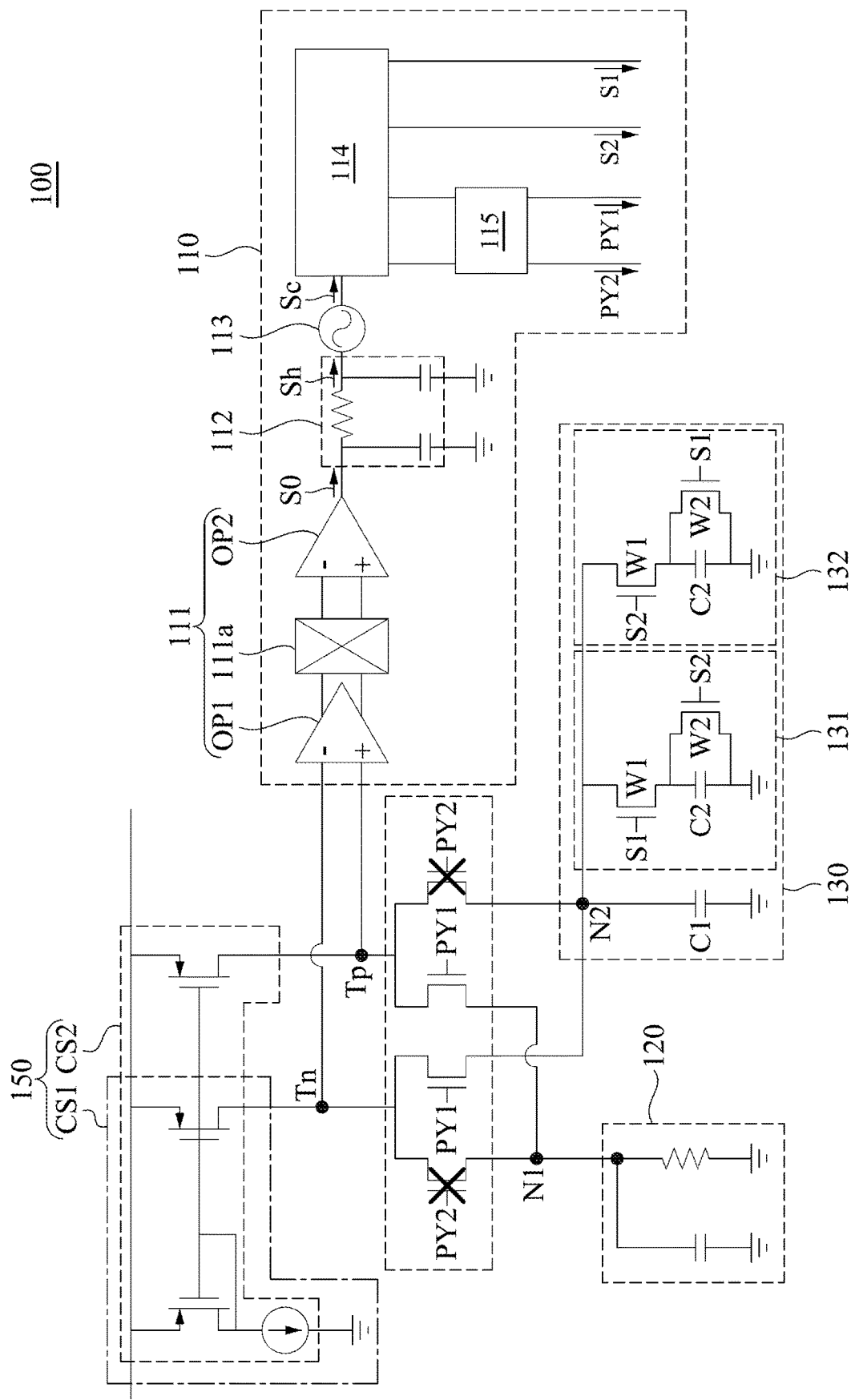
FIG. 4A is a schematic diagram of the operational state of the frequency locked loop circuit in some embodiments of the present disclosure.

Referring to FIG. 1 and FIG. 4A, in a first period, the first control signal PY1 is an enable level, the second control signal PY2 is a disable level. Alternatively stated, a level of the first control signal PY1 and the second control signal PY2 are opposite. Therefore, the first transistor switch T11 and the second transistor switch T22 are turned on. The second transistor switch T12 and the first transistor switch T21 are turned off. At this time, the first switching unit 141 conducts the negative terminal Tn to the second impedance circuit 130 through the first transistor switch T11. The second switching unit 142 conducts the positive terminal Tp to the first impedance circuit 120 through the second transistor switch T22.

Figure 4B:
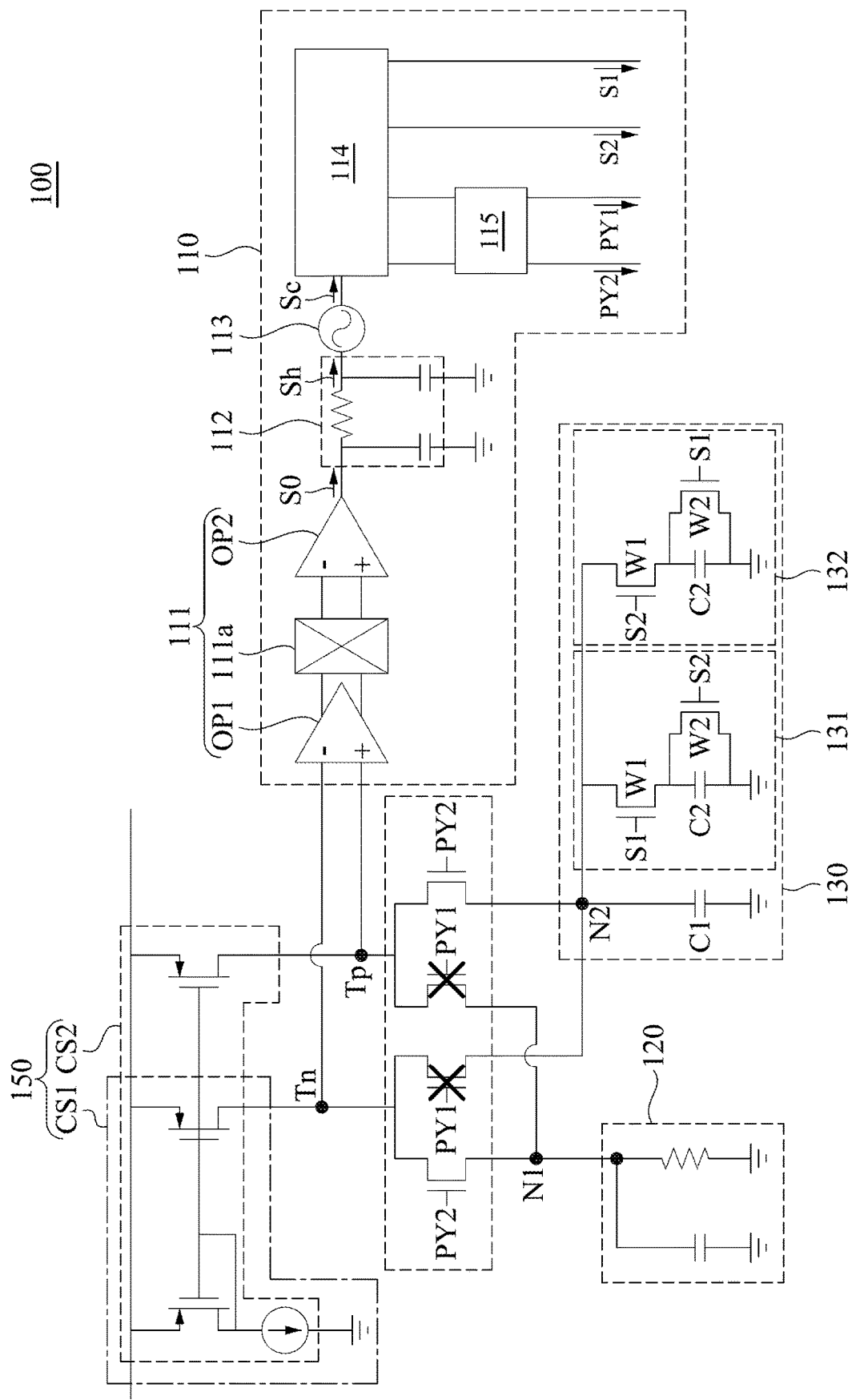
FIG. 4B is a schematic diagram of the operational state of the frequency locked loop circuit in some embodiments of the present disclosure.

Similarly, referring to FIG. 1 and FIG. 4B, in a second period, the first control signal PY1 is the disable level, the second control signal PY2 is the enable level. Therefore, the second transistor switch T12 and the first transistor switch T21 are turned on. The first transistor switch T11 and the second transistor switch T22 are turned off. At this time, the first switching unit 141 conducts the negative terminal Tn to the first impedance circuit 120 through the second transistor switch T12. The second switching unit 142 conducts the positive terminal Tp to the second impedance circuit 130 through the first transistor switch T21.

In the embodiments disclosed above, a switching circuit can be disposed and configured to periodically conduct a negative terminal to one of a first impedance node and a second impedance node, and periodically conduct a positive terminal to the other one of the first impedance node and the second impedance node. The switching operations simultaneously performed by the switching circuit and a chopper operational amplifier in a the frequency generation circuit can achieve noise cancellation. Consequently, an output clock signal generated by the frequency locked loop circuit can have less jitter caused by noises generated by current sources and the frequency generation circuit.

Figure 5A:
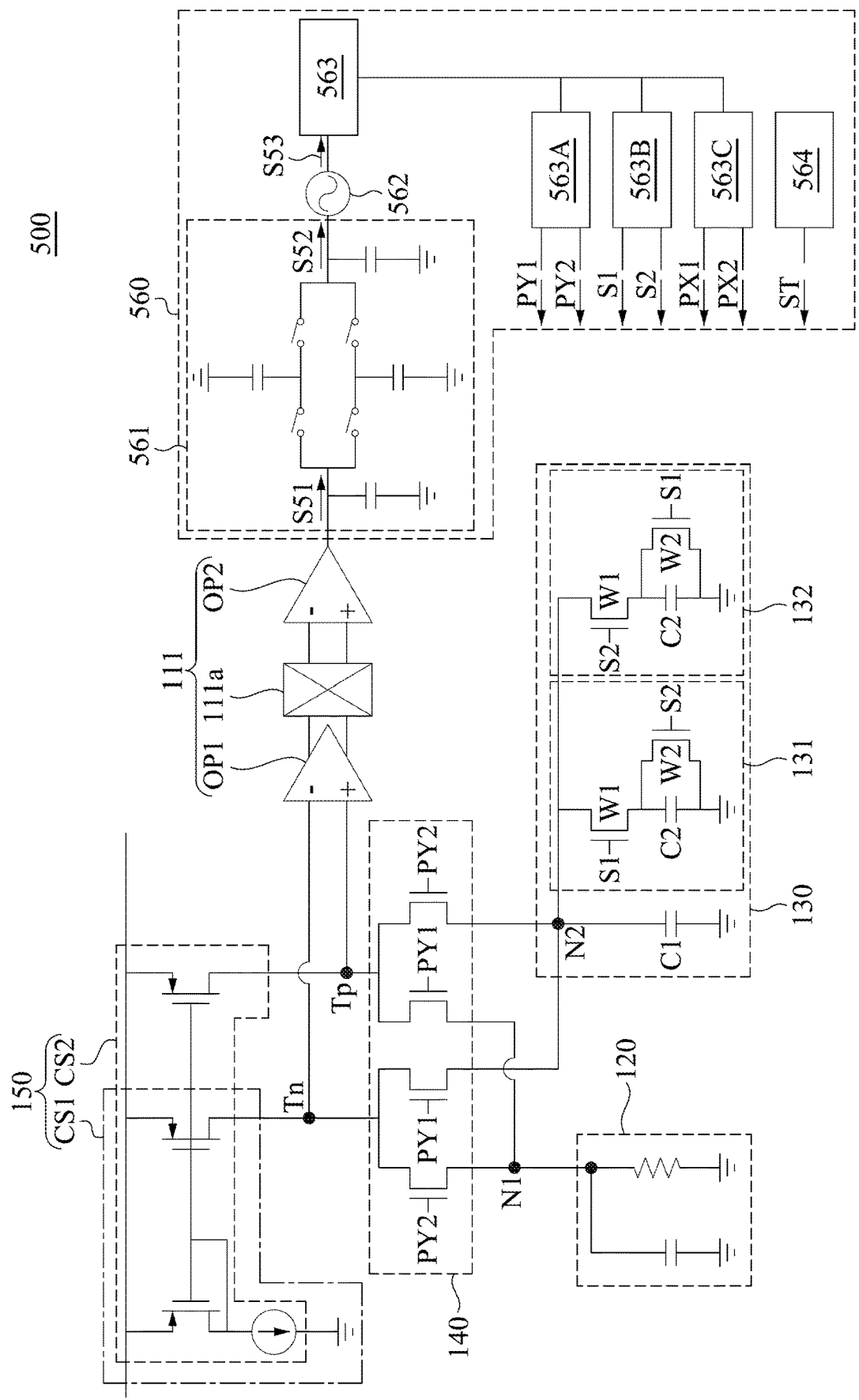
FIG. 5A is a schematic diagram of a frequency locked loop circuit in some embodiments of the present disclosure.

FIG. 5A is a schematic diagram of a frequency locked loop circuit in some embodiments of the present disclosure. In FIG. 5A, the similar components associated with the embodiment of FIG. 1 are labeled with the same numerals for ease of understanding. The specific principle of the similar component has been explained in detail in the previous paragraphs, and unless it has a cooperative relationship with the components of FIG. 5A, it is not repeated here.

The frequency locked loop circuit 500 includes an operational circuit 510, a first impedance circuit 120, a second impedance circuit 130, a switching circuit 140 and a frequency generation circuit 560. The first impedance circuit 120, the second impedance circuit 130 and the switching circuit 140 can be the same as the embodiment shown in FIG. 1, and the operational circuit 510 can be implemented by the chopper operational amplifier 111 shown in FIG. 1 so details will not be described here.

The operational circuit 510 includes a positive terminal Tp and a negative terminal Tn, and is configured to output an operational signal S51 according to a voltage difference between the positive terminal Tp and the negative terminal Tn. The operational circuit 510 generates the operational signal S51 in the same manner as the chopper operational amplifier 111 generates the operational voltage signal S0 shown in FIG. 1.

The frequency generation circuit 560 is electrically coupled to the operational circuit 510 to receive the operational signal S51. The frequency generation circuit 560 is configured to periodically sample the operational signal S51 to generate a sample signal S52. Then, The frequency generation circuit 560 further generates a clock signal S53 (like the output clock signal Sc in FIG. 1) according to the sample signal S52. A sampling period of the sample signal S52 is an integer multiple of an operational period of the operational signal S51. In other words, an operational frequency of the operational signal is an integer multiple of a sampling frequency of the frequency generation circuit.

In some embodiments, the frequency generation circuit 560 includes a sample and hold circuit 561. The sample and hold circuit 561 is electrically coupled to the operational circuit 510, and is configured to store and output the operational signal S51 (i.e., sample) according to the sampling frequency, periodically and sequentially. By periodically sampling the operational signal S51 to generate the sample signal S52, low frequency noise in the operational signal S51 can be reduced.

Specifically, the current sources 150 and the frequency generation circuit 110 may have low frequency noise. The low frequency noise are random and therefore cannot be eliminated by periodically switching the negative terminal Tn and the positive terminal Tp to conduct to the first impedance node N1 or the second impedance node N2. Ideally, the operational signal S51 output by the operational circuit 510 should be a fixed voltage signal, so that the clock signal generated by the frequency locked loop circuit 500 will have a fixed frequency. Therefore, by periodically sampling the operational signal S51 and controlling the operational frequency of the operational signal to be an integer multiple of the sampling frequency of the frequency generation circuit, the sample signal S52 can be a fixed voltage signal.

Figure 5B:
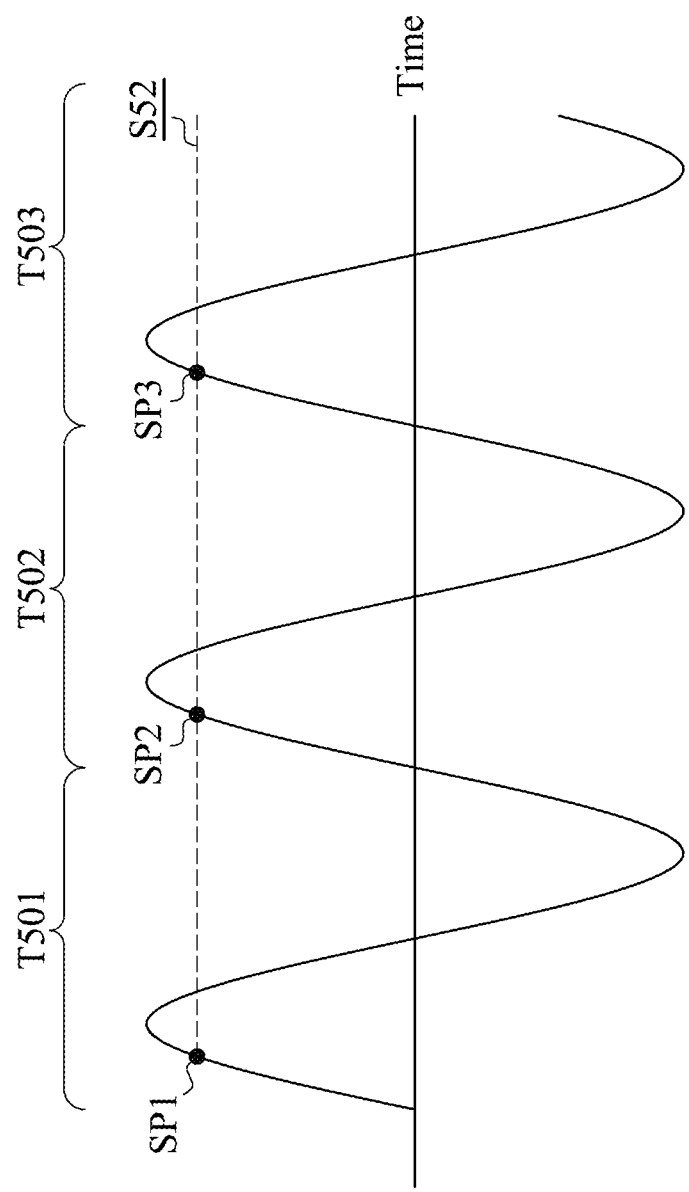
FIG. 5B is a schematic diagram of the operational signal S51 in some embodiments of the present disclosure.

FIG. 5B is a schematic diagram of the operational signal S51 in some embodiments of the present disclosure. In FIG. 5B, the operational signal S51 is presented in the form of a sin wave to indicate that the operational signal S51 has random low frequency noise. As shown in FIG. 5B, although the value of the operational signal S51 is unstable, the sample and hold circuit 561 samples the operational signal S51 every one or more period, and the value of the sample signal S52 output by the sample and hold circuit 561 will be stable. For example, the sample and hold circuit 561 samples the operational signal S51 a sample point SP1/SP2/SP3 in every period T51-T53. Accordingly, the sample signal S52 formed by sample points SP1-SP3 will approach a fixed value.

In some embodiments, the frequency generation circuit 560 further includes a voltage-controlled oscillator 562 and a frequency divider 563. The voltage-controlled oscillator 562 is electrically coupled to the sample and hold circuit 561 to receive the sample signal S52. The voltage-controlled oscillator 562 is configured to generate the clock signal S53 according to the sample signal S52.

The frequency divider 563 is electrically coupled to the voltage-controlled oscillator 562 to receive the clock signal S53. The frequency divider 563 is configured to generate a first switching signal PX1 and a second switching signal PX2 according to the clock signal S53. The first switching signal PX1 and the second switching signal PX2 are provided to sample and hold circuit 561, so that the sample and hold circuit 561 samples the operational signal S51 according to the sampling frequency.

The frequency divider 563 is further configured to generate the first control signal PY1 and the second control signal PY2 according to the clock signal S53. The first control signal PY1 and the second control signal PY2 is provided to the switching circuit 140. Similarly, the frequency divider 563 can generate the first clock signal S1 and the second clock signal S2 according to the clock signal S53. The first clock signal S1 and the second clock signal S2 are provided to impedance units W1-W2 to control the impedance value of the second impedance circuit 130. Since the application of the signals PY1, PY2, S1 and S2 is the same as the above-mentioned embodiment in FIG. 1, it will not be repeated here.

In one embodiment, the frequency divider 563 of the frequency generation circuit 560 further includes multiple non-overlapping circuit 563A-563C. The non-overlapping circuit 563A-563C are configured to generate signals PX1/PX2, PY1/PY2 and S1/S2 according to the clock signal S53. The non-overlapping circuit 563A-563C is configured to ensure that the first switching signal PX1 and the second switching signal PX2 are not turned on at the same time or turned off at the same time, and is configured to ensure that the first control signal PY1 and the second control signal PY2 (or the first clock signal S1 and the second clock signal S2) are not turned on at the same time or turned off at the same time.

Figure 5C:
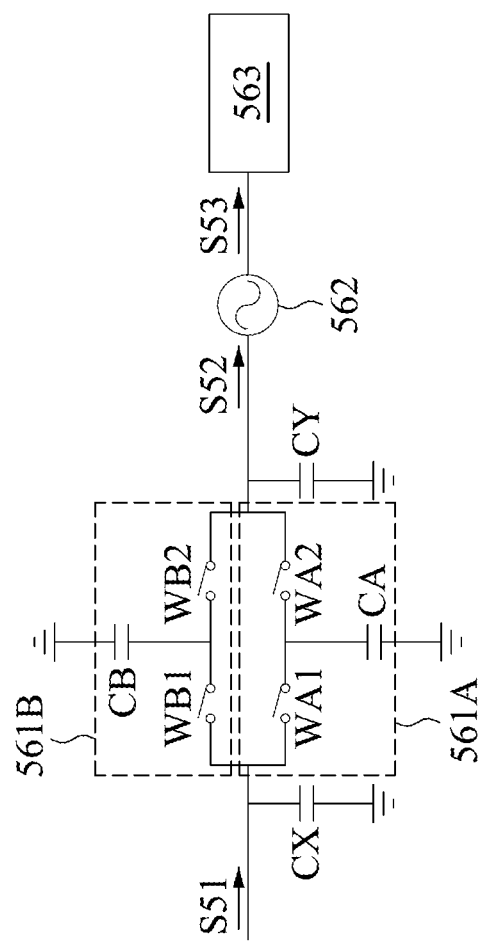
FIG. 5C is a partial schematic diagram of the frequency generation circuit in some embodiments of the present disclosure.

FIG. 5C is a partial schematic diagram of the frequency generation circuit 560 in some embodiments of the present disclosure. In some embodiments, the sample and hold circuit 561 at least includes a first sample circuit 561A. The first sample circuit 561A includes a first switch WA1, a second switch WA2 and a temporary capacitor CA. One terminal of the first switch WA1 is electrically coupled to a first capacitor CX and the operational circuit 510. Other terminal of the first switch WA1 is electrically coupled to the second switch WA2 and the temporary capacitor CA.

The first switch WA1 and the second switch WA2 are turned on or turned off according to the sampling frequency. Specifically, the first switch WA1 is controlled by the first switching signal PX1, and the second switch WA2 is controlled by the second switching signal PX2. A level of the first switching signal PX1 and a level of the second switching PX2 are opposite.

When the first switch WA1 is turned on and the second switch WA2 is turned off, the temporary capacitor CA is configured to store the operational signal S51. When the first switch WA1 is turned on and the second switch WA2 is turned off, the temporary capacitor CA is configured to store the operational signal S51. When the first switch WA1 is turned off and the second switch WA2 is turned on, the temporary capacitor CA is configured to output the stored operational signal S51 as the sample signal.

In other embodiments, the sample and hold circuit 561 further includes a second sample circuit 561B. The second sample circuit 561B includes a third switch WB1, a fourth switch WB2 and a temporary capacitor CB. One terminal of the third switch WB1 is electrically coupled to the first capacitor CX and the operational circuit 510. Other terminal of the third switch WB1 is electrically coupled to the fourth switch WB2 and the temporary capacitor CB.

The third switch WB1 and the fourth switch WB2 are turned on or turned off according to the sampling frequency. Specifically, the third switch WB1 is controlled by the second switching signal PX2, and the fourth switch WB2 is controlled by the first switching signal PX1. Therefore, when the temporary capacitor CA of the first sample circuit stores the operational signal, the temporary capacitor CB of the second sample circuit 561B is configured to output the operational signal as the sample signal. On the other hand, when the temporary capacitor CA of the first sample circuit output the operational signal as the sample signal, the temporary capacitor CB of the second sample circuit 561B is configured to stores the operational signal. In other words, the sampling times of the first sample circuit 561A and the second sample circuit 561B are interleaved with each other.

Referring to FIG. 5A, in some embodiments, the frequency generation circuit 560 further includes a detection circuit 564. The detection circuit 564 is electrically coupled to the voltage-controlled oscillator 562 and the second impedance circuit 130. The detection circuit 564 is configured to detect an impedance value of the second impedance circuit 130, or detect the voltage on the second impedance node N2. Then, the detection circuit 564 selectively generates a driving signal ST to drive the voltage-controlled oscillator 562.

For example, since the impedance value of the impedance units 131/132 will be "1/(clock frequency×capacitance)", the impedance value will become extremely large because the clock signal S53 is not generated (i.e., frequency is zero). When the impedance value of the second impedance circuit 130 is higher than an impedance threshold, the detection circuit 564 is configured to provide a driving signal ST to the voltage-controlled oscillator 562. When the impedance value of the second impedance circuit 130 becomes higher, the voltage on the second impedance node N2 will also become higher. Therefore, in some embodiments, the detection circuit 564 is configured to detect the voltage on the second impedance node N2, so as to determine whether to generate the driving signal ST.

Specifically, when the frequency locked loop circuit 500 is initially driven, the sample and hold circuit 561 cannot operate automatically (i.e., sequentially sample the operational signal S51 every one or more period) because the frequency generation circuit 560 has not received the operational signal S51 and has not generated the clock signal. At this time, the second impedance circuit 130 also does not receive the first clock signal S1 and the second clock signal S2, resulting in a high impedance value (e.g., similar to open circuit) of the second impedance circuit 130. Therefore, the detection circuit 564 provides a driving signal ST to the voltage-controlled oscillator 562, so that the voltage-controlled oscillator 562 outputs the clock signal S53. The voltage level of the driving signal ST can be adjusted, and the detection circuit 564 will provide the driving signal ST for a period of time until the frequency generation circuit 560 generates signals PX1/PX2/PY1/PY2/S1/S2 and the operational circuit 510 to output the operational signal S51.

Figure 6:
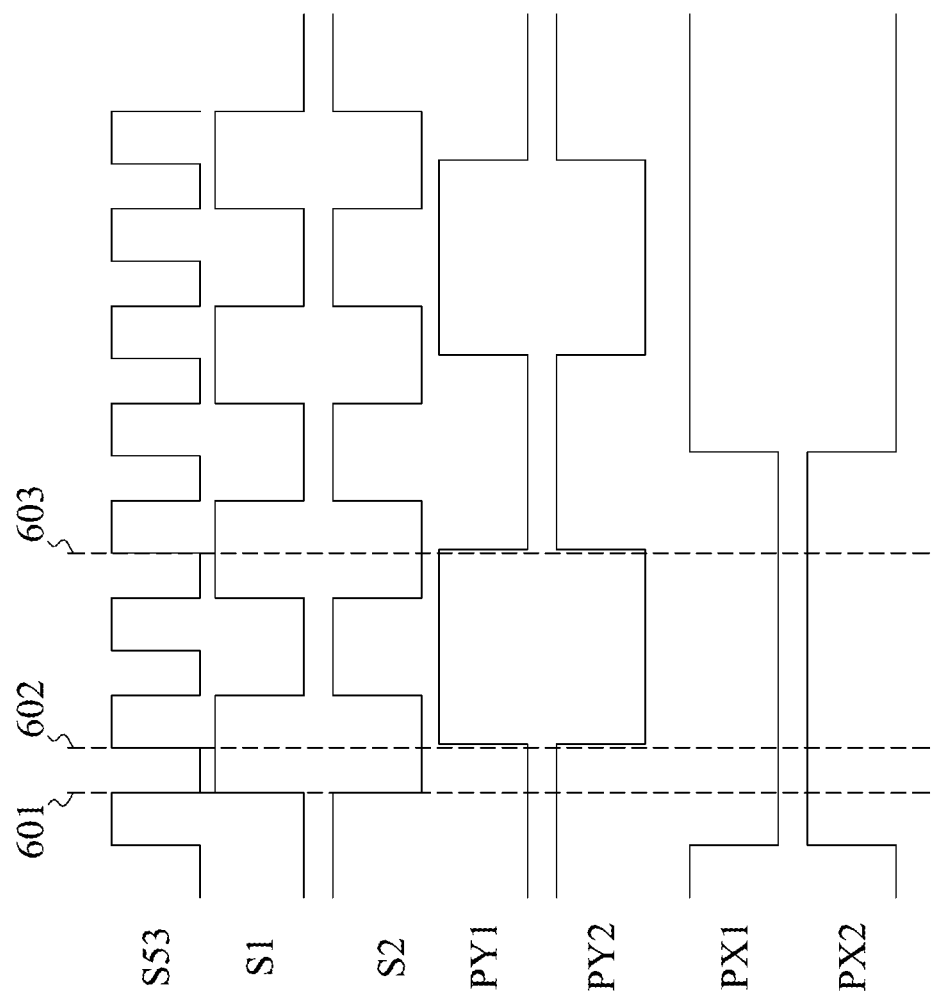
FIG. 6 is a schematic waveform of signals in some embodiments of the present disclosure.

FIG. 6 is a schematic waveform of signals S53/PX1/PX2/PY1/PY2/S1/S2 in some embodiments of the present disclosure. The frequency generation circuit 560 generates signals S53/PX1/PX2/PY1/PY2/S1/S2 according to the clock signal S53. As shown in FIG. 6, the frequency generation circuit 560 generates clock signals S1/S2 at a first time point 601. Then, the frequency generation circuit 560 generates control signals PY1/PY2 at a second time point 602. The frequency generation circuit 560 generates switching signals PX1/PX2 at a third time point 603. In other words, the frequency generation circuit 560 generates signals S53/PX1/PX2/PY1/PY2/S1/S2 at different time points (i.e., at different rising edge or falling edge).

In addition, in the embodiment shown in the FIG. 6, a sampling period of the sample signal S52 (i.e., period of switching signals PX1/PX2) is twice as much as an operational period of the operational signal S51 (i.e., period of control signals PY1/PY2). In other words, an operational frequency of the operational signal (i.e., frequency of control signals PY1/PY2) is twice as much as a sampling frequency of the sample and hold circuit 561 (i.e., frequency of switching signals PX1/PX2).

Figure 7:
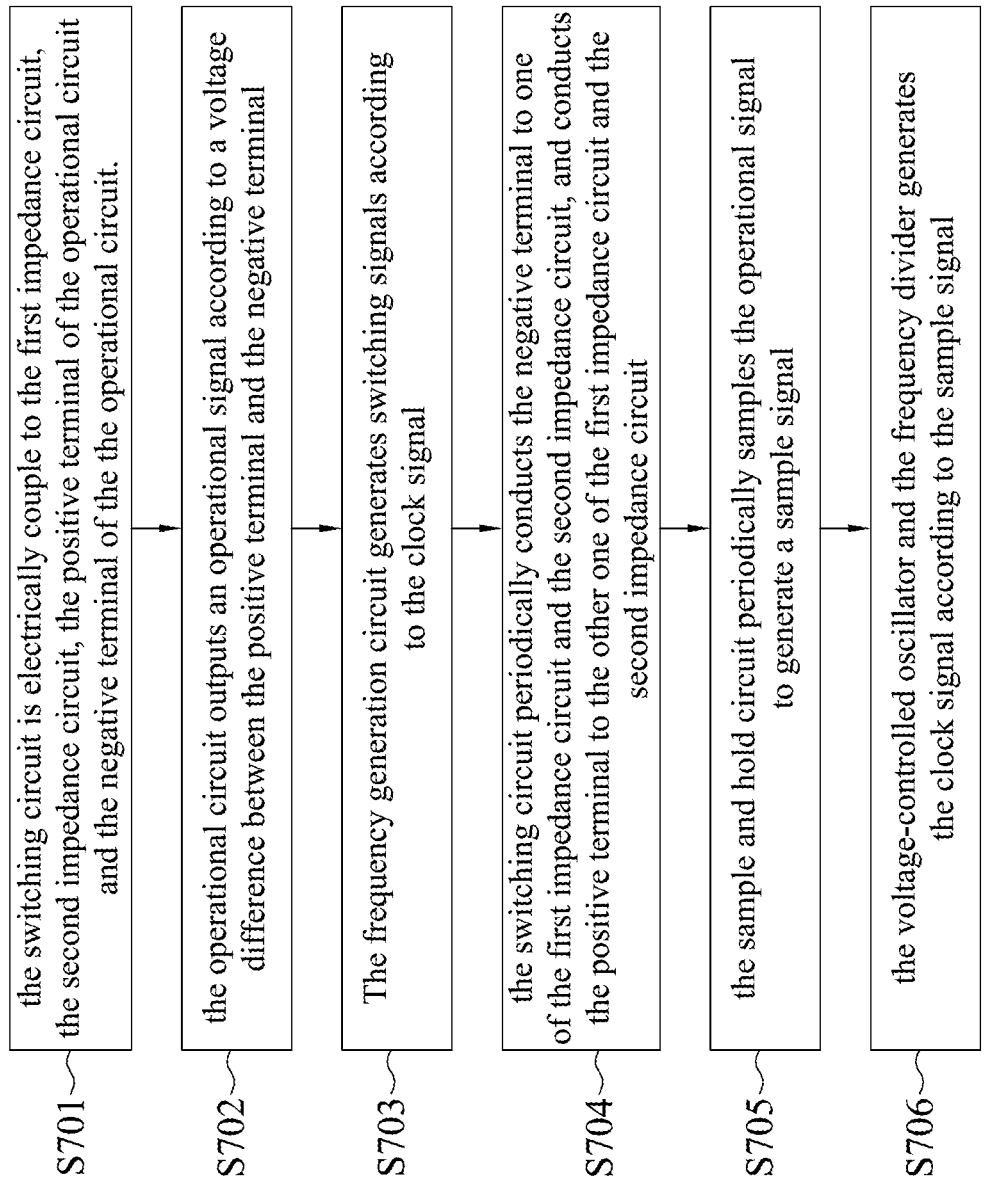
FIG. 7 is a flowchart illustrating a clock signal generation method in some embodiments of the present disclosure.

Referring to the FIG. 7, FIG. 7 is a flowchart illustrating a clock signal generation method in some embodiments of the present disclosure. In step S701, the switching circuit 140 is electrically couple to the first impedance circuit 120, the second impedance circuit 130, the positive terminal Tp of the operational circuit 510 and the negative terminal Tn of the operational circuit 510.

In step S702, the operational circuit 510 outputs an operational signal S51 according to a voltage difference between the positive terminal Tp and the negative terminal Tn. As mentioned above, if the frequency locked loop circuit 500 is initially driven, so the frequency generation circuit 560 has not received the operational signal S51 and has not generated the clock signal S53, the detection circuit 564 provides a driving signal ST to the voltage-controlled oscillator 562, so that the voltage-controlled oscillator 562 outputs the clock signal S53.

In step S703, the frequency generation circuit 560 generates signals S53/PX1/PX2/PY1/PY2/S1/S2 according to the clock signal S53. In step S704, the switching circuit 140 periodically conducts the negative terminal Tn to one of the first impedance circuit 120 and the second impedance circuit 130, and conducts the positive terminal Tp to the other one of the first impedance circuit 120 and the second impedance circuit 130.

In step S705, the sample and hold circuit 561 periodically samples the operational signal S51 to generate a sample signal S52. The operational frequency of the operational signal S51 is an integer multiple of the sampling frequency of the sample and hold circuit 561. In step S706, the voltage-controlled oscillator 562 and the frequency divider 563 generates the clock signal S53 according to the sample signal S52.

Accordingly, by periodically sampling the operational signal S51 and controlling the operational frequency of the operational signal S51 to be an integer multiple of the sampling frequency of the sample and hold circuit 561, the sample signal S52 can be a fixed voltage signal, and the frequency of the clock signal S53 can be maintained stable.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A frequency locked loop circuit, comprising:
   an operational circuit comprising a positive terminal and a negative terminal, wherein the operational circuit is configured to output an operational signal according to a voltage difference between the positive terminal and the negative terminal;
   a first impedance circuit electrically coupled to a first impedance node;
   a second impedance circuit electrically coupled to a second impedance node;
   a switching circuit electrically coupled to the first impedance node, the second impedance node, the positive terminal and the negative terminal, wherein the switching circuit is configured to periodically conduct the negative terminal to one of the first impedance node and the second impedance node, and periodically conduct the positive terminal to the other one of the first impedance node and the second impedance node; and
   a frequency generation circuit electrically coupled to the operational circuit to receive the operational signal, and configured to periodically sample the operational signal to generate a sample signal to generate a clock signal, wherein an operational frequency of the operational signal is an integer multiple of a sampling frequency of the frequency generation circuit.

2. The frequency locked loop circuit of claim 1, wherein the frequency generation circuit comprises:
   a sample and hold circuit electrically coupled to the operational circuit, wherein the sample and hold circuit comprises a first switch, a second switch and a temporary capacitor, wherein the first switch and the second switch are turned on or turned off according to the sampling frequency; and
   when the first switch is turned on and the second switch is turned off, the temporary capacitor is configured to store the operational signal, when the first switch is turned off and the second switch is turned on, the temporary capacitor is configured to output the stored operational signal as the sample signal.

3. The frequency locked loop circuit of claim 2, wherein the frequency generation circuit further comprises:
   a voltage-controlled oscillator electrically coupled to the sample and hold circuit, and configured to generate the clock signal according to the sample signal; and
   a frequency divider electrically coupled to the voltage-controlled oscillator to receive the clock signal, and configured to generate a first switching signal and a second switching signal, wherein the first switching signal and the second switching signal are provided to control the first switch and the second switch, and a level of the first switching signal and a level of the second switching signal are opposite.

4. The frequency locked loop circuit of claim 1, wherein the frequency generation circuit comprises a sample and hold circuit, and the sample and hold circuit comprises:
   a first sample circuit electrically coupled to the operational circuit, and configured to sample the operational signal according to the sampling frequency; and
   a second sample circuit electrically coupled to the operational circuit, and configured to sample the operational signal according to the sampling frequency, wherein when the first sample circuit stores the operational signal, the second sample circuit is configured to output the operational signal as the sample signal.

5. The frequency locked loop circuit of claim 1, wherein the frequency generation circuit comprises:
   a sample and hold circuit electrically coupled to the operational circuit, and configured to generate the sample signal according to the sampling frequency;
   a voltage-controlled oscillator electrically coupled to the sample and hold circuit to receive the sample signal, and configured to generate the clock signal; and
   a detection circuit electrically coupled to the voltage-controlled oscillator, and configured to detect an impedance value of the second impedance circuit, wherein when the impedance value of the second impedance circuit is higher than an impedance threshold, the detection circuit is configured to provide a driving signal to the voltage-controlled oscillator, so that the voltage-controlled oscillator outputs the clock signal.

6. The frequency locked loop circuit of claim 1, wherein the second impedance circuit is configured to adjust an impedance value of the second impedance circuit according to the clock signal.

7. The frequency locked loop circuit of claim 6, wherein the second impedance circuit comprises:
   a plurality of impedance units, wherein each of the plurality of impedance units is coupled between the second impedance node and a reference voltage; and
   a first capacitor electrically coupled in parallel with the plurality of impedance units.

8. The frequency locked loop circuit of claim 7, wherein the frequency generation circuit is further configured to generate a first clock signal and a second clock signal, the first clock signal and the second clock signal are provided to the plurality of impedance units to control the impedance value of the second impedance circuit, and a level of the first clock signal and a level of the second clock signal are opposite.

9. The frequency locked loop circuit of claim 8, wherein the frequency generation circuit is further configured to generate a first control signal and a second control signal according to the clock signal and provide the first control signal and the second control signal to the switching circuit.

10. The frequency locked loop circuit of claim 9, wherein the switching circuit comprises a plurality of switching units, comprising:
    a first switching unit electrically coupled to the first impedance node, the second impedance node and the negative terminal, wherein the first switching unit is configured to conduct the negative terminal to one of the first impedance node and the second impedance node according to the first control signal and the second control signal; and
    a second switching unit electrically coupled to the first impedance node, the second impedance node and the positive terminal, wherein the second switching unit is configured to conduct the positive terminal to the other one of the first impedance node and the second impedance node according to the first control signal and the second control signal.

11. The frequency locked loop circuit of claim 10, wherein a frequency of each of the first control signal and the second control signal is less than a frequency of the first clock signal and the second clock signal.

12. The frequency locked loop circuit of claim 11, wherein each of the plurality of switching units comprises:
a first transistor switch electrically coupled to one of the first impedance node and the second impedance node, and electrically coupled to one of the positive terminal and the negative terminal, wherein the first transistor switch is further configured to turn on or turn off according to one of the first control signal and the second control signal; and
a second transistor switch electrically coupled to the other one of the first impedance node and the second impedance node, and electrically coupled to the one of the positive terminal and the negative terminal, wherein the second transistor switch is further configured to turn on or turn off according to the other one of the first control signal and the second control signal.

13. The frequency locked loop circuit of claim 12, wherein each of the plurality of impedance units comprises:
a first impedance switch electrically coupled to the second impedance node, and configured to be controlled according to the first clock signal and the second clock signal;
a second impedance switch electrically coupled to the first impedance switch and the reference voltage, and configured to be controlled according to the first clock signal and the second clock signal, wherein a conducted timing of the first impedance switch and the second impedance switch are opposite; and
a second capacitor electrically coupled in parallel to the second impedance switch in parallel.

14. The frequency locked loop circuit of claim 1, further comprising a current mirror comprising a first current source and a second current source, and the switching circuit comprises a first switching unit electrically coupled to the first current source through the negative terminal and a second switching unit electrically coupled to the second current source through the positive terminal.

15. A clock signal generation method, comprising:
electrically coupling a switching circuit to a first impedance circuit, a second impedance circuit, a positive terminal of an operational circuit and a negative terminal of the operational circuit;
outputting, by the operational circuit, an operational signal according to a voltage difference between the positive terminal and the negative terminal;
periodically conducting the negative terminal to one of the first impedance circuit and the second impedance circuit by the switching circuit, and periodically conducting the positive terminal to the other one of the first impedance circuit and the second impedance circuit by the switching circuit;
periodically sampling, by a frequency generation circuit, the operational signal to generate a sample signal, wherein an operational frequency of the operational signal is an integer multiple of a sampling frequency of the frequency generation circuit; and
generating a clock signal according to the sample signal.

16. The clock signal generation method of claim 15, further comprising:
generating, by the frequency generation circuit, a first switching signal and a second switching signal according to the clock signal;
providing the first switching signal and the second switching signal to a sample and hold circuit of the frequency generation circuit; and
controlling a first switch and a second switch of the sample and hold circuit according to the first switching signal and the second switching signal, wherein a level of the first switching signal and a level of the second switching signal are opposite.

17. The clock signal generation method of claim 15, wherein periodically sampling the operational signal to generate the sample signal comprises:
sampling, by a first sample circuit of the frequency generation circuit, the operational signal according to the sampling frequency; and
sampling, by a second sample circuit of the frequency generation circuit, the operational signal according to the sampling frequency, wherein when the first sample circuit stores the operational signal, the second sample circuit is configured to output the operational signal as the sample signal.

18. The clock signal generation method of claim 15, further comprising:
detecting, by a detection circuit, an impedance value of the second impedance circuit; and
when the impedance value of the second impedance circuit is higher than an impedance threshold, providing a driving signal to a voltage-controlled oscillator of the frequency generation circuit to output the clock signal.

19. The clock signal generation method of claim 15, further comprising:
adjusting an impedance value of the second impedance circuit according to the clock signal.

20. The clock signal generation method of claim 15, wherein periodically conducting the negative terminal to one of the first impedance circuit and the second impedance circuit further comprises:
turning on or turning off a first transistor switch of the switching circuit according to a first control signal; and
turning on or turning off a second transistor switch of the switching circuit according to a second control signal, wherein a level of the first control signal and the second control signal are opposite.

* * * * *